United States Patent
Asthana et al.

(12) 
(10) Patent No.: US 10,217,506 B1
(45) Date of Patent: Feb. 26, 2019

(54) DUMMY WORDLINE UNDERDRIVE CIRCUITRY

(71) Applicant: ARM Limited, Cambridge (GB)

(72) Inventors: Vivek Asthana, Noida (IN); Nitin Jindal, Noida (IN); Nikhil Kaushik, Noida (IN); Kapil Mittal, Noida (IN); Divyank Gupta, New Delhi (IN); Shakir Malik, Noida (IN); Stefi Bhavsar, Noida (IN)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/690,562

(22) Filed: Aug. 30, 2017

(51) Int. Cl.
*G11C 11/418* (2006.01)
*H01L 27/11* (2006.01)
*G11C 11/419* (2006.01)
*H01L 21/8238* (2006.01)

(52) U.S. Cl.
CPC ........ *G11C 11/418* (2013.01); *H01L 27/1116* (2013.01); *G11C 11/419* (2013.01); *H01L 21/823871* (2013.01)

(58) Field of Classification Search
CPC . G11C 11/418; G11C 11/419; H01L 27/1116; H01L 21/823871
USPC .... 365/154, 185.11, 185.12, 185.13, 185.23, 365/185.25, 51, 63, 129, 156, 189.011, 365/189.14, 189.05, 189.08, 210.1, 365/210.11, 210.13, 214, 230.01, 233.15, 365/230.06
See application file for complete search history.

(56) References Cited

U.S. PATENT DOCUMENTS

| | | | |
|---|---|---|---|
| 2003/0059997 A1 | 3/2003 | Bedarida et al. | |
| 2005/0278592 A1* | 12/2005 | Yamada | G11C 7/14 714/721 |
| 2007/0030741 A1* | 2/2007 | Nii | G11C 5/06 365/189.11 |
| 2008/0151604 A1 | 6/2008 | Suzuki | |
| 2013/0141962 A1 | 6/2013 | Liaw | |
| 2014/0112065 A1 | 4/2014 | Tanabe | |
| 2017/0301396 A1 | 10/2017 | Dhori et al. | |

FOREIGN PATENT DOCUMENTS

EP 2092527 b1 * 3/2016

* cited by examiner

*Primary Examiner* — Fernando Hidalgo
(74) *Attorney, Agent, or Firm* — Pramudji Law Group PLLC; Ari Pramudji

(57) ABSTRACT

Various implementations described herein are directed to an integrated circuit. The integrated circuit may include dummy wordline circuitry having a dummy wordline driver coupled to a dummy wordline load via a dummy wordline. The integrated circuit may include underdrive circuitry coupled to the dummy wordline between the dummy wordline driver and the dummy wordline load. The underdrive circuitry may generate an underdrive on the dummy wordline when the dummy wordline is selected and driven by the dummy wordline driver.

20 Claims, 4 Drawing Sheets

DUMMY WORDLINE UNDERDRIVE CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Generally, in an attempt to inhibit degradation of read and write margins, some memory devices have attempted to support read and write operations by delaying data access signals in the signal timing path to recover read margins. In some cases, a dummy wordline (DWL) is used to track an actual wordline (WL), while a dummy bitline (DBL) is used to track an actual bitline (BL). Along with matching resistance (R), capacitance (C), and logic delays in a signal timing path, a local mismatch of bitcell transistors is evaluated and a reduction of bitcell current is compensated for. This may be taken care of by having additional delays in the data signal path, either by having less number of discharge cells or by increasing logic delays. However, this may result in a penalty in performance at a power, performance and area (PPA) corner, because degradation of bitcell current due to offset is less at the PPA corner, while the delays may be designed as per a read and write margin corner. Thus, there exists a need to improve integrated circuitry so as to enable recovery of degraded read and write margins in a more efficient manner.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to and are directed to dummy wordline (DWL) underdrive circuitry for memory applications. In some implementations, the DWL underdrive circuitry may be used for self-time tracking schemes and techniques for memory applications, such as, e.g., SRAM applications, which may track read current offset in bitcells with minimum penalty on performance. Some principles of the schemes and techniques described herein may refer to matching bitcell offset by underdriving the dummy wordline DWL by a same amount of the bitcell offset. In some technologies, the bitcell offset may be modelled as a voltage threshold (Vt) offset of a pass gate transistor, and the bitcell offset may be constant or vary slightly with a source voltage (Vdd).

Various implementations of dummy wordline (DWL) underdrive circuitry for memory applications will now be described in greater detail herein with reference to FIGS. 1-3.

Figure 1:
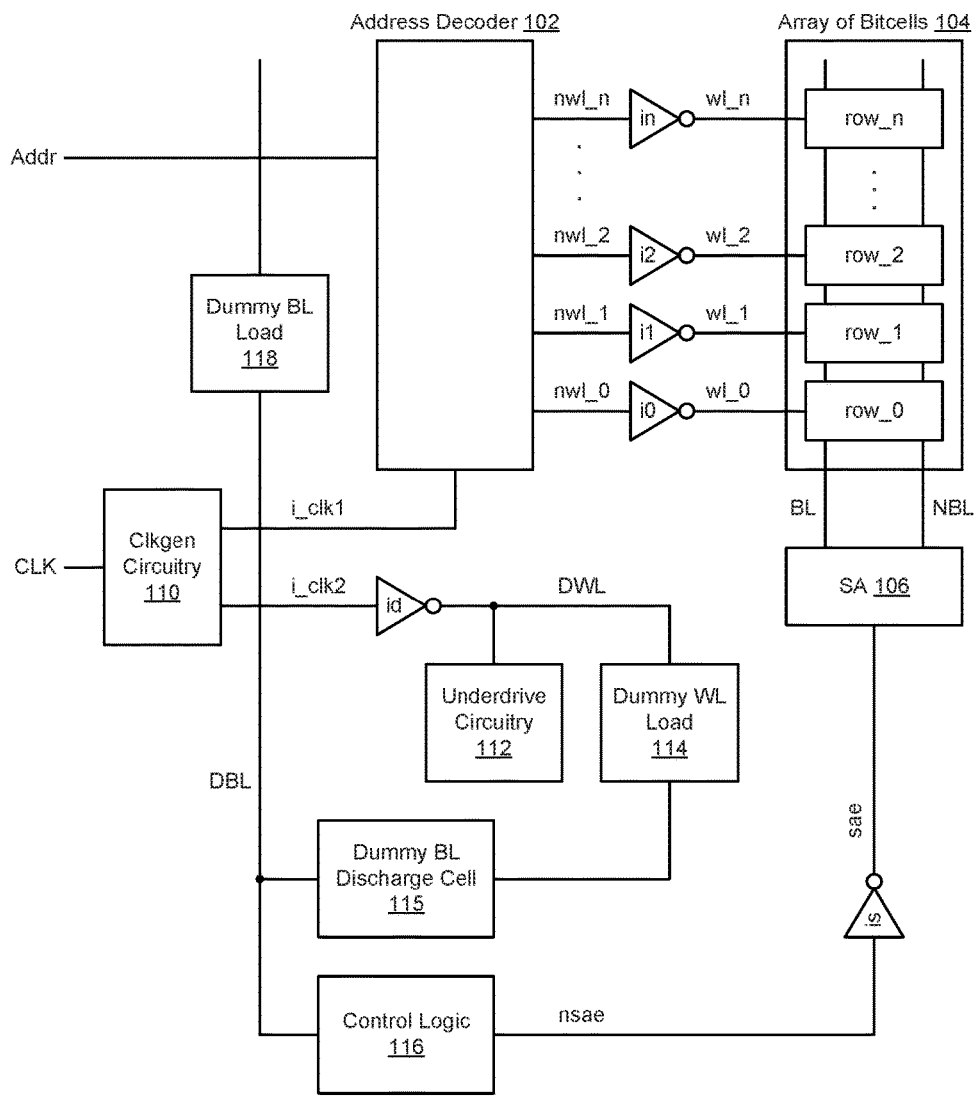
FIG. 1 illustrates a diagram of memory circuitry in accordance with various implementations described herein.

FIG. 1 illustrates a block diagram of memory circuitry 100 in accordance with various implementations described herein.

As shown in FIG. 1, the memory circuitry 100 may include various circuitry including an address decoder 102, an array of bitcells 104, sense amplifier circuitry 106, clock generation circuitry 110, and dummy wordline (DWL) underdrive circuitry 112. The memory circuitry 100 may include the array of bitcells 104 having multiple rows of bitcells row_0, row_1, row_2, . . . , row_n. The sense amplifier circuitry 106 may be coupled to each of the bitcells in each of the rows of bitcells row_0, row_1, row_2, . . . , row_n via complementary bitlines (BL, NBL). The memory circuitry 100 may also include a number of inverted wordlines (e.g., nwl_0, nwl_1, nwl_2, . . . , nwl_n) that are coupled between the address decoder 102 and corresponding rows of bitcells row_0, row_1, row_2, . . . , row_n for access to each of the bitcells based on a selected wordline. Each of the inverted wordlines nwl_0, nwl_1, nwl_2, . . . , nwl_n have a corresponding wordline driver (e.g., inverters i0, i1, i2, . . . , in) coupled thereto to provide wordlines signals (e.g., wl_0, wl_1, wl_2, . . . , wl_n) to the corresponding rows of bitcells row_0, row_1, row_2, . . . , row_n.

The memory circuitry 100 may receive a clock signal CLK and an address signal Addr. The clock generation circuitry (Clkgen) 110 may receive the clock signal CLK and provide one or more internal clock signals, such as, e.g., a first internal clock signal i_clk1 to the address decoder 102 and a second internal clock signal i_clk2 to a dummy wordline driver (e.g., inverter id) via a dummy wordline (DWL). The address decoder 102 may receive multiple signals including, e.g., the address signal Addr and the first internal clock signal i_clk1 and then access at least one inverted wordline (e.g., nwl_0, nwl_1, nwl_2, . . . , nwl_n) based on the received address signal Addr.

As further shown in FIG. 1, the memory circuitry 100 may include the dummy wordline (DWL) driver (id), the dummy wordline (DWL) underdrive circuitry 112, a dummy wordline (DWL) load 114, and a dummy bitline (DBL) discharge cell 115 coupled to the dummy wordline DWL. The memory circuitry 100 may include control logic circuitry 116 and a dummy bitline (DBL) load 118 coupled to the dummy bitline (DBL). As shown, the control logic circuitry 116 may be coupled to the sense amplifier circuitry 106 via another inverter (is). The control circuitry 116 may provide an inverted sense amplifier enable signal (nsae) to the inverter (is), and the inverter (is) may then provide a complementary sense amplifier enable signal (sae). As shown, the second internal clock signal i_clk2 is input to the dummy wordline driver (e.g., inverter id) via the dummy wordline DWL, which is coupled to the DWL underdrive circuitry 112 and the DWL load 114.

In some implementations, the dummy wordline (DWL) underdrive circuitry 112 may include (or make use of) the dummy wordline driver (id), which is coupled to the dummy wordline load 114 via the dummy wordline DWL. The dummy wordline (DWL) underdrive circuitry 112 may be coupled to the dummy wordline DWL between the dummy wordline driver (id) and the dummy wordline load 114. The dummy wordline (DWL) underdrive circuitry 112 may generate an underdrive on the dummy wordline DWL when the dummy wordline DWL is selected and driven by the dummy wordline driver (id).

In various implementations, each bitcell in the array of bitcells 104 may also be referred to as a memory cell, and each bitcell may be configured to store at least one data bit value (e.g., a data value associated with logical '0' or '1'). Each row of bitcells row_0, row_1, row_2, . . . , row_n in the array of bitcells 104 may include any number of bitcells or memory cells arranged in various configurations, such as, e.g., a two-dimensional (2D) memory array having columns and rows of multiple bitcells arranged in a 2D grid pattern with 2D indexing capabilities. Each bitcell may be implemented with random access memory (RAM) circuitry, or some other type of volatile type memory. For instance, each memory cell may include a multi-transistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit.

Generally, there are multiple types of memory structures: one-wordline devices (i.e., single port) and multi-wordline devices (i.e., multi-port memory, such as, e.g., dual port memory). One-wordline devices (e.g., ROM, RAM, DRAM, SRAM, etc.) may refer to devices having only one access port, which may be referred to as access devices. The bitlines may utilize single rail or dual rail architecture. The transistor types (e.g., N-type MOS and P-type MOS) may be referred to as access transistors. In some scenarios, high-density SRAM bitcells that are implemented with minimally sized transistors may limit Vmin of a design. However, in FinFET technology, device sizing quantization remains a challenge for compact 6T SRAM bitcells with minimum-size transistors. Thus, in some implementations, careful optimization of design memory assist circuits may be used to deliver low power memory operation. Further, each bitcell in the array of bitcells 104 may be accessed with a wordline WL and complementary bitlines BL, NBL.

Generally, static RAM bitcells may include 6T bitcells, which may have access ports controlled by wordlines (WLs). In some other cases, static RAM bitcells may be implemented with a 5T bitcell, 4T 2R bitcell, or various other types of CMOS SRAM cells, such as, e.g., 8T, 10T or more transistors per bit. Further, multi-wordlines may result in multiple access ports into each of the bitcells. Since there are multiple access ports, the multi-ports access devices may be varied within each bitcell so that some access devices (by port) are NFETs and some access devices by port are PFETs. Although these may be effectively varied within each single bitcell, their number of ports may not be easily divided into equal capacitance and/or power. Thus, although these multi-ports transistor types may vary within each bitcell, there may also be a need to have a variation between arrays as in a left half array and a right half array.

The memory circuitry 100 including each bitcell in the array of bitcells 104 may be implemented as an integrated circuit (IC) with various types of memory circuitry, such as, e.g., random access memory (RAM), and/or any other types of memory, including any type of volatile memory and non-volatile memory. The memory circuitry 100 may be implemented as an IC with single and/or dual rail memory architectures. The memory circuitry 100 may also be integrated with computing circuitry and related components on a single chip. Further, the memory circuitry 100 may be implemented in an embedded system for various types of electronic, mobile, and/or biometric applications.

Figure 2A:
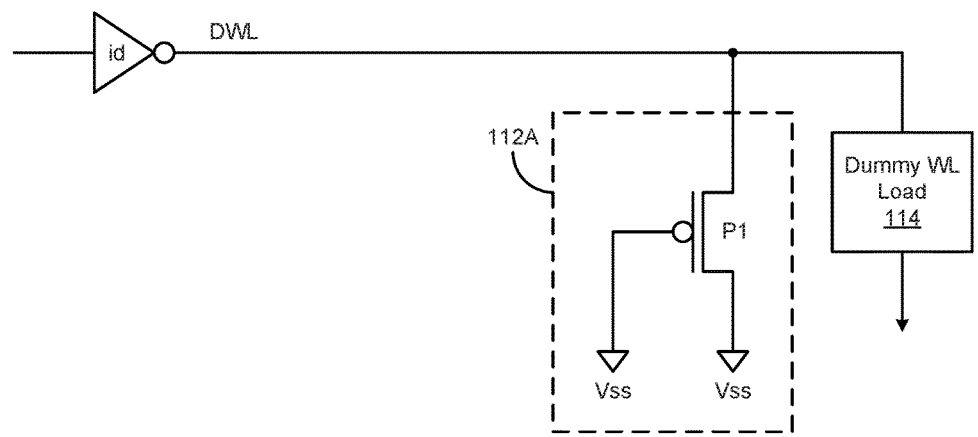
FIGS. 2A-2D illustrate various diagrams of dummy wordline (DWL) underdrive circuitry in accordance with various implementations described herein.
Figure 2B:
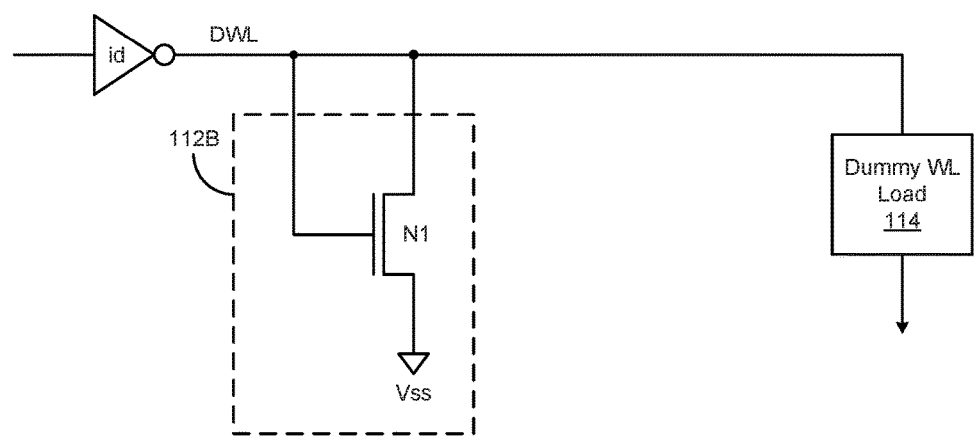
Figure 2C:
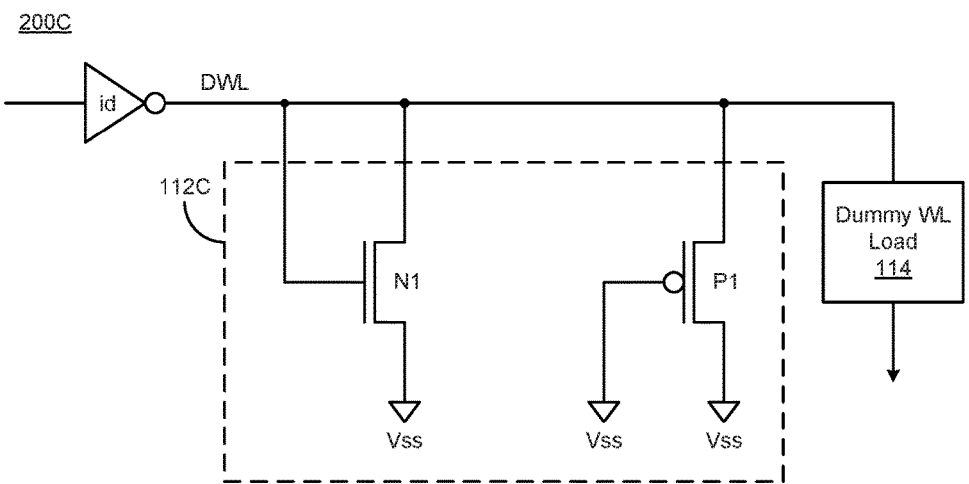
Figure 2D:
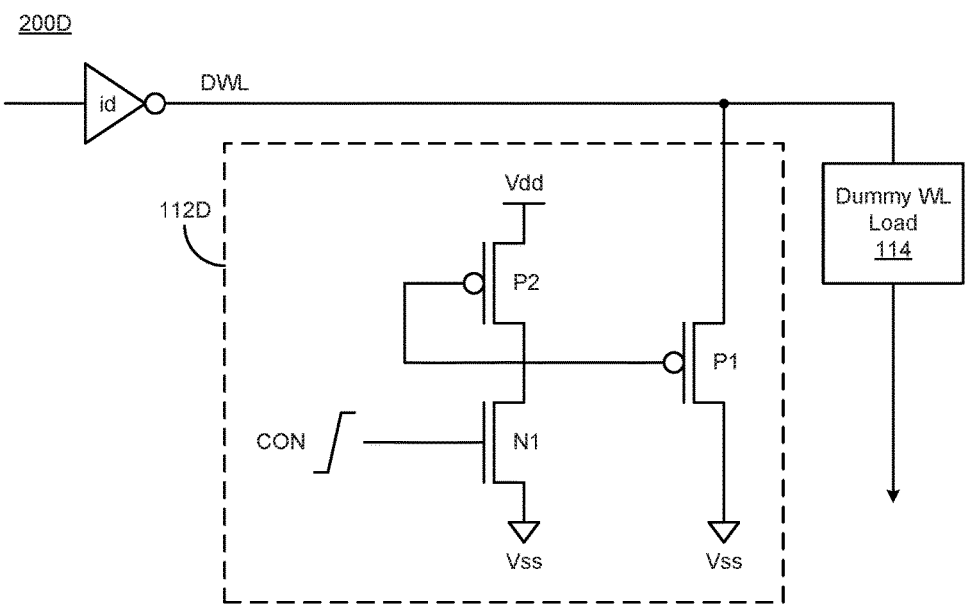

FIGS. 2A-2D illustrate various schematic diagrams 200A, 200B, 200C, 200D of dummy wordline (DWL) underdrive circuitry 112 of FIG. 1 in accordance with various implementations described herein. In particular, FIG. 2A illustrates a first schematic diagram 200A of a first implementation of DWL underdrive circuitry 112A coupled to the dummy wordline DWL, FIG. 2B illustrates a second schematic diagram 200B of a second implementation of DWL underdrive circuitry 112B coupled to the dummy wordline DWL, FIG. 2C illustrates a third schematic diagram 200C of a third implementation of DWL underdrive circuitry 112C coupled to the dummy wordline DWL, and FIG. 2D illustrates a fourth schematic diagram 200D of a fourth implementation of DWL underdrive circuitry 112D coupled to the dummy wordline DWL.

As shown in the schematic diagram 200A of FIG. 2A, an embodiment of the DWL underdrive circuitry 112A may be coupled to the dummy wordline load 114 via the dummy wordline DWL. The DWL underdrive circuitry 112A may utilize the at least one dummy wordline driver (e.g., inverter id), which is also coupled to the dummy wordline DWL. Sometimes, the at least one dummy wordline driver (id) may be included as part of the DWL underdrive circuitry 112A. In some implementations, the DWL underdrive circuitry 112A may include at least one transistor P1 that is coupled to the dummy wordline DWL between the dummy wordline driver (id) and the dummy wordline load 114. The at least one transistor P1 may be coupled between the dummy wordline DWL and a negative voltage supply (Vss). As shown in FIG. 2A, the at least one transistor P1 may be a p-type metal-oxide-semiconductor (PMOS) transistor, and a gate of the at least one transistor P2 may be coupled to the negative voltage supply (Vss). The negative voltage supply (Vss) may refer to ground (GND) having zero voltage.

In some implementations, the DWL underdrive circuitry 112A may be referred to as a DWL underdrive circuit having a PMOS bleeder, such as, e.g., the PMOS transistor P1. The DWL driver (id) may include multiple transistors, such as, e.g., a PMOS transistor and an NMOS transistor. In some instances, during operation, as the input to the DWL driver (id) goes low, a resistive divider network established with two (2) PMOS transistors (e.g., inverter PMOS and P1) may cause wordline underdrive (WLUD) that is proportional to the positive source voltage (Vdd).

As shown in the schematic diagram 200B of FIG. 2B, another embodiment of the dummy wordline (DWL) underdrive circuitry 112B may be coupled to the dummy wordline load 114 via the dummy wordline DWL. The DWL underdrive circuitry 112B may utilize the at least one dummy wordline driver (e.g., inverter id), which is also coupled to the dummy wordline DWL. Sometimes, the at least one dummy wordline driver (id) may be included as part of the DWL underdrive circuitry 112B. In some implementations, the DWL underdrive circuitry 112A may include at least one transistor N1 that is coupled to the dummy wordline DWL between the dummy wordline driver (id) and the dummy wordline load 114. The at least one transistor N1 may be coupled between the dummy wordline DWL and the negative voltage supply (Vss). As shown in FIG. 2B, the at least one transistor N1 may be an n-type MOS (NMOS) transistor, and a gate of the at least one transistor N1 may be coupled to the dummy wordline DWL between the dummy wordline driver (id) and the dummy wordline load 114 so as to receive an output of the dummy wordline driver (id).

In some implementations, the DWL underdrive circuitry 112B may be referred to as a DWL underdrive circuit having an NMOS bleeder, such as, e.g., the NMOS transistor N1. The DWL driver (id) may include multiple transistors, such as, e.g., a PMOS transistor and an NMOS transistor. In some instances, during operation, as the input to the DWL driver (id) goes low, a resistive divider network established with inverter PMOS transistor and the NMOS transistor N1 may cause wordline underdrive (WLUD) that is proportional to the relative process variation of PMOS and NMOS.

As shown in the schematic diagram 200C of FIG. 2C, another embodiment of the dummy wordline (DWL) underdrive circuitry 112C may be coupled to the dummy wordline load 114 via the dummy wordline DWL. The DWL underdrive circuitry 112C may utilize the at least one dummy wordline driver (e.g., inverter id), which is also coupled to the dummy wordline DWL. Sometimes, the at least one dummy wordline driver (id) may be included as part of the DWL underdrive circuitry 112C. In some implementations, the DWL underdrive circuitry 112C may include multiple transistors N1, P1 that are coupled to the dummy wordline DWL between the dummy wordline driver (id) and the dummy wordline load 114. The multiple transistors may include a first transistor P1 and a second transistor N1 that are coupled to the dummy wordline DWL between the dummy wordline driver (id) and the dummy wordline load 114. The first transistor P1 may be coupled between the dummy wordline DWL and the negative voltage supply (Vss), and a gate of the first transistor P1 may also be coupled to the negative voltage supply (Vss). The second transistor N2 may be coupled between the dummy wordline DWL and the negative voltage supply (Vss), and a gate of the second transistor N2 may be coupled to the dummy wordline DWL between the dummy wordline driver (id) and the dummy wordline load 114 so as to receive an output of the dummy wordline driver (id). As shown in FIG. 2B, the first transistor P1 may be a p-type MOS (PMOS) transistor, and the second transistor N1 may be an n-type MOS (NMOS) transistor.

In some implementations, the DWL underdrive circuitry 112C may be referred to as a hybrid DWL underdrive circuit having a PMOS bleeder, such as, e.g., the PMOS transistor P1, and an NMOS bleeder, such as, e.g., the NMOS transistor N1, which is coupled in an n-diode configuration. As described herein, the DWL driver (id) may include multiple transistors, such as, e.g., a PMOS transistor and an NMOS transistor. In some instances, during operation, the NMOS bleeder N1 may provide process tracking of a bitcell offset, while usage of the PMOS bleeder P1 controls a voltage spread of the DWL underdrive supply level.

As shown in the schematic diagram 200D of FIG. 2D, another embodiment of the dummy wordline (DWL) underdrive circuitry 112D may be coupled to the dummy wordline load 114 via the dummy wordline DWL. The DWL underdrive circuitry 112D may utilize the at least one dummy wordline driver (e.g., inverter id), which is also coupled to the dummy wordline DWL. Sometimes, the at least one dummy wordline driver (id) may be included as part of the DWL underdrive circuitry 112D. In some implementations, the DWL underdrive circuitry 112D may include multiple transistors P1, N1, P2 that are arranged and coupled to the dummy wordline DWL between the dummy wordline driver (id) and the dummy wordline load 114. The multiple transistors may include the first transistor P1, the second transistor N1, and a third transistor P2 that are coupled to the dummy wordline DWL between the dummy wordline driver (id) and the dummy wordline load 114. The first transistor P1 may be coupled between the dummy wordline DWL and the negative voltage supply (Vss), and a gate of the first transistor P1 may be coupled to a gate of the third transistor P2. The second and third transistors N1, P2 may be coupled together in a stack such that the third transistor P2 is coupled between a positive voltage supply (Vdd) and the second transistor N1 and such that the second transistor N1 is coupled between the third transistor P2 and the negative voltage supply (Vss). Further, the second transistor N1 may be activated and deactivated based on a control signal (CON) that is applied to the gate of the second transistor N1.

In some implementations, the DWL underdrive circuitry 112D may be referred to as an adaptive DWL underdrive circuit having a PMOS bleeder, such as, e.g., the PMOS transistor P1. As described herein, the DWL driver (id) may include multiple transistors, such as, e.g., a PMOS transistor and an NMOS transistor. In some instances, during operation, as the positive voltage source (Vdd) increases, the gate of bleeder PMOS P1 goes up, thus weakening the bleeder PMOS P1 and causing less wordline underdrive (WLUD) at a higher positive source voltage (Vdd).

Figure 3:
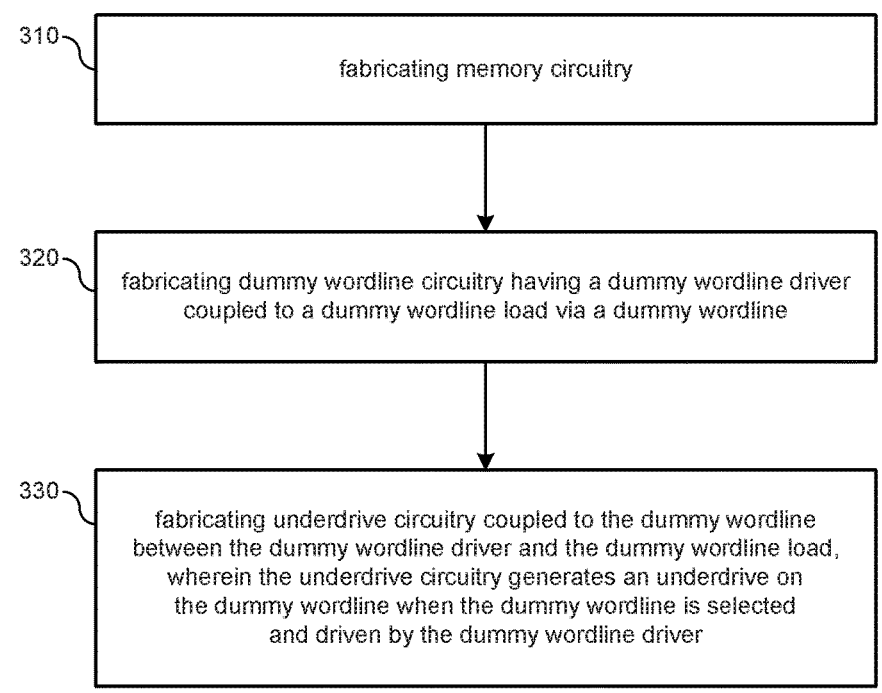
FIG. 3 illustrates a method of fabricating dummy wordline (DWL) underdrive circuitry in accordance with various implementations described herein.

FIG. 3 illustrates a process flow diagram of a method for 300 fabricating dummy wordline (DWL) underdrive circuitry in accordance with various implementations described herein.

It should be understood that even though method 300 may indicate a particular order of operation execution, in some cases, various certain portions of the operations may be executed in a different order, and on different systems. In other cases, additional operations and/or steps may be added to and/or omitted from method 300. Method 300 may be implemented in hardware and/or software. If implemented in hardware, the method 300 may be implemented with various circuit components, such as described herein above in reference to FIGS. 1-2D. If implemented in software, method 300 may be implemented as a program or software instruction process that may be configured for the DWL underdrive circuitry as described herein. Further, if implemented in software, instructions related to implementing the method 300 may be stored in memory and/or a database. For instance, a computer or various other types of computing devices having a processor and memory may be configured to perform method 300.

As described and shown in reference to FIG. 3, method 300 may be utilized for manufacturing an integrated circuit (IC) that implements dummy wordline (DWL) underdrive circuitry in various types of memory applications. For instance, as described herein, method 300 may be utilized for manufacturing dummy wordline (DWL) underdrive circuitry for memory applications, wherein the dummy wordline (DWL) underdrive circuitry may be adaptive to pressure, voltage, and temperature (PVT).

At block 310, method 300 may fabricate memory circuitry. At block 320, method 300 may fabricate dummy wordline circuitry having a dummy wordline driver coupled to a dummy wordline load via a dummy wordline DWL. In some cases, the underdrive circuitry may be referred to as dummy wordline (DWL) underdrive circuitry. At block 330, method 300 may fabricate underdrive circuitry coupled to the dummy wordline DWL between the dummy wordline driver and the dummy wordline load. In some cases, the underdrive circuitry may generate an underdrive on the dummy wordline DWL when the dummy wordline DWL is selected and driven by the dummy wordline driver.

In some implementations, the underdrive circuitry may include at least one transistor that is coupled to the dummy wordline DWL between the dummy wordline driver and the dummy wordline load, and the at least one transistor may be coupled between the dummy wordline DWL and a negative voltage supply (Vss). The at least one transistor may be a PMOS transistor, and a gate of the at least one transistor may be coupled to the negative voltage supply (Vss). The negative voltage supply (Vss) may refer to ground (GND) having zero voltage.

In some other implementations, the at least one transistor may be an NMOS transistor, and a gate of the at least one transistor may be coupled to the dummy wordline DWL between the dummy wordline driver and the dummy wordline load so as to receive an output of the dummy wordline driver.

In some other implementations, the underdrive circuitry may include multiple transistors including a first transistor and a second transistor that are coupled to the dummy wordline between the dummy wordline driver and the dummy wordline load. The first transistor may be coupled between the dummy wordline DWL and a negative voltage supply (Vss), and a gate of the first transistor may be coupled to the negative voltage supply (Vss). The second transistor may be coupled between the dummy wordline DWL and a negative voltage supply (Vss), and a gate of the second transistor may be coupled to the dummy wordline DWL between the dummy wordline driver and the dummy wordline load so as to receive an output of the dummy wordline driver. Further, the first transistor may be a PMOS transistor and the second transistor may be an NMOS transistor.

In some other implementations, the underdrive circuitry may include multiple transistors including a first transistor, a second transistor, and a third transistor that are arranged and coupled to the dummy wordline DWL between the dummy wordline driver and the dummy wordline load. The first transistor may be coupled between the dummy wordline DWL and a negative voltage supply (Vss), and a gate of the first transistor may be coupled to a gate of the third transistor. The second and third transistors may be coupled together in a stack such that the third transistor is coupled between a positive voltage supply (Vdd) and the second transistor and such that the second transistor is coupled between the third transistor and the negative voltage supply (Vss). Further, the second transistor may be activated and deactivated based on a control signal.

Described herein are various implementations of an integrated circuit. The integrated circuit may include dummy wordline circuitry having a dummy wordline driver coupled to a dummy wordline load via a dummy wordline. The integrated circuit may include underdrive circuitry coupled to the dummy wordline between the dummy wordline driver and the dummy wordline load. The underdrive circuitry may generate an underdrive on the dummy wordline when the dummy wordline is selected and driven by the dummy wordline driver.

Described herein are various implementations of an integrated circuit. The integrated circuit may include dummy wordline circuitry having a dummy wordline driver coupled to a dummy wordline load via a dummy wordline. The integrated circuit may include underdrive circuitry having multiple transistors arranged and coupled to the dummy wordline between the dummy wordline driver and the dummy wordline load. The underdrive circuitry may include multiple transistors that are arranged to generate an underdrive on the dummy wordline when the dummy wordline is selected and driven by the dummy wordline driver.

Described herein are various implementations of a method for manufacturing an integrated circuit. The method may include fabricating dummy wordline circuitry having a dummy wordline driver coupled to a dummy wordline load via a dummy wordline. The method may include fabricating underdrive circuitry coupled to the dummy wordline between the dummy wordline driver and the dummy wordline load. The underdrive circuitry may generate an underdrive on the dummy wordline when the dummy wordline is selected and driven by the dummy wordline driver.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
wordline circuitry having wordline drivers coupled to wordline loads via wordlines;
dummy wordline circuitry having a dummy wordline driver coupled to a dummy wordline load via a dummy wordline, wherein the dummy wordline circuitry is separate from the wordline circuitry; and
underdrive circuitry coupled to the dummy wordline between the dummy wordline driver and the dummy wordline load,
wherein the underdrive circuitry generates an underdrive on the dummy wordline when the dummy wordline is selected and driven by the dummy wordline driver.

2. The integrated circuit of claim 1, wherein the underdrive circuitry comprises at least one transistor that is coupled to the dummy wordline between the dummy wordline driver and the dummy wordline load, and wherein the at least one transistor is further coupled between the dummy wordline and a negative voltage supply (Vss).

3. The integrated circuit of claim 2, wherein a gate of the at least one transistor is coupled to the negative voltage supply (Vss).

4. The integrated circuit of claim 2, wherein the at least one transistor comprises a p-type metal-oxide-semiconductor (PMOS) transistor.

5. The integrated circuit of claim 2, wherein the negative voltage supply (Vss) refers to ground (GND) having zero voltage.

6. The integrated circuit of claim 2, wherein a gate of the at least one transistor is coupled to the dummy wordline between the dummy wordline driver and the dummy wordline load so as to receive an output of the dummy wordline driver.

7. The integrated circuit of claim 2, wherein the at least one transistor comprises an n-type metal-oxide-semiconductor (NMOS) transistor.

8. The integrated circuit of claim 1, wherein the underdrive circuitry comprises multiple transistors including a first transistor and a second transistor that are coupled to the dummy wordline between the dummy wordline driver and the dummy wordline load.

9. The integrated circuit of claim 8, wherein the first transistor is further coupled between the dummy wordline and a negative voltage supply (Vss), and wherein a gate of the first transistor is also coupled to the negative voltage supply (Vss), and wherein the negative voltage supply (Vss) refers to ground (GND) having zero voltage.

10. The integrated circuit of claim 8, wherein the second transistor is further coupled between the dummy wordline and a negative voltage supply (Vss), and wherein a gate of the second transistor is coupled to the dummy wordline between the dummy wordline driver and the dummy wordline load so as to receive an output of the dummy wordline driver, and wherein the negative voltage supply (Vss) refers to ground (GND) having zero voltage.

11. The integrated circuit of claim 8, wherein the first transistor comprises a p-type metal-oxide-semiconductor (PMOS) transistor and the second transistor comprises an n-type metal-oxide-semiconductor (NMOS) transistor.

12. The integrated circuit of claim 1, wherein the underdrive circuitry comprises multiple transistors including a first transistor, a second transistor, and a third transistor that are arranged and coupled to the dummy wordline between the dummy wordline driver and the dummy wordline load.

13. The integrated circuit of claim 12, wherein the first transistor is further coupled between the dummy wordline and a negative voltage supply (Vss), and wherein a gate of the first transistor is also coupled to a gate of the third transistor, and wherein the negative voltage supply (Vss) refers to ground (GND) having zero voltage.

14. The integrated circuit of claim 13, wherein the second and third transistors are coupled together in a stack such that the third transistor is coupled between a positive voltage supply (Vdd) and the second transistor and such that the second transistor is coupled between the third transistor and the negative voltage supply (Vss), and wherein the second transistor is activated and deactivated based on a control signal.

15. An integrated circuit, comprising:
wordline circuitry having wordline drivers coupled to wordline loads via wordlines;
dummy wordline circuitry having a dummy wordline driver coupled to a dummy wordline load via a dummy wordline, wherein the dummy wordline circuitry is separate from the wordline circuitry; and
underdrive circuitry coupled to the dummy wordline between the dummy wordline driver and the dummy wordline load,
wherein the underdrive circuitry comprises multiple transistors that are arranged to generate an underdrive on the dummy wordline when the dummy wordline is selected and driven by the dummy wordline driver.

16. The integrated circuit of claim 15, wherein the multiple transistors comprise a first transistor, a second transistor, and a third transistor that are arranged to generate the underdrive, and wherein one or more of the first transistor, the second transistor, and the third transistor are coupled to the dummy wordline between the dummy wordline driver and the dummy wordline load.

17. The integrated circuit of claim 16, wherein the first transistor is further coupled between the dummy wordline and a negative voltage supply (Vss), and wherein a gate of the first transistor is also coupled to a gate of the second transistor, and wherein the negative voltage supply (Vss) refers to ground (GND) having zero voltage.

18. The integrated circuit of claim 17, wherein the second and third transistors are coupled together in a stack such that the third transistor is coupled between a positive voltage supply (Vdd) and the second transistor and such that the second transistor is coupled between the third transistor and the negative voltage supply (Vss), and wherein the second transistor is activated and deactivated based on a control signal.

19. A method for manufacturing an integrated circuit, the method comprising:
fabricating wordline circuitry having wordline drivers coupled to wordline loads via wordlines;
fabricating dummy wordline circuitry having a dummy wordline driver coupled to a dummy wordline load via a dummy wordline, wherein the dummy wordline circuitry is separate from the wordline circuitry; and fabricating underdrive circuitry coupled to the dummy wordline between the dummy wordline driver and the dummy wordline load, wherein the underdrive circuitry generates an underdrive on the dummy wordline when the dummy wordline is selected and driven by the dummy wordline driver.

20. The method of claim 19, wherein:

the underdrive circuitry comprises multiple transistors including a first transistor, a second transistor, and a third transistor, the first transistor is coupled between the dummy wordline and a negative voltage supply (Vss) that refers to ground (GND) having zero voltage, a gate of the first transistor is also coupled to a gate of the second transistor, the second and third transistors are coupled together in a stack such that the third transistor is coupled between a positive voltage supply (Vdd) and the second transistor and such that the second transistor is coupled between the third transistor and the negative voltage supply (Vss), and the second transistor is activated and deactivated based on a control signal.

* * * * *